United States Patent
Chang et al.

(10) Patent No.: US 9,899,271 B2
(45) Date of Patent: Feb. 20, 2018

(54) STRUCTURE AND FORMATION METHOD OF SEMICONDUCTOR DEVICE STRUCTURE

(71) Applicant: Taiwan Semiconductor Manufacturing Company, Ltd., Hsin-Chu (TW)

(72) Inventors: Che-Cheng Chang, New Taipei (TW); Jui-Ping Chuang, Hsin-Chu (TW); Chen-Hsiang Lu, Hsin-Chu (TW); Wei-Ting Chen, Hsin-Chu (TW); Yu-Cheng Liu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/368,322

(22) Filed: Dec. 2, 2016

(65) Prior Publication Data
US 2017/0084499 A1 Mar. 23, 2017

Related U.S. Application Data

(63) Continuation of application No. 14/725,118, filed on May 29, 2015, now Pat. No. 9,559,205.

(51) Int. Cl.
*H01L 21/8238* (2006.01)
*H01L 29/78* (2006.01)
(Continued)

(52) U.S. Cl.
CPC ........... *H01L 21/823842* (2013.01); *H01L 21/823814* (2013.01); *H01L 21/823821* (2013.01); *H01L 21/823857* (2013.01); *H01L 21/823878* (2013.01); *H01L 27/0922* (2013.01); *H01L 27/0924* (2013.01); *H01L 29/0653* (2013.01); *H01L 29/0847* (2013.01);
(Continued)

(58) Field of Classification Search
CPC ............ H01L 29/785; H01L 29/66553; H01L 29/66545; H01L 29/66795
USPC ...................................................... 257/401
See application file for complete search history.

(56) References Cited

U.S. PATENT DOCUMENTS 8,586,436 B2    11/2013  Ng et al.
2005/0087810 A1  4/2005  Sadra et al.
(Continued)

FOREIGN PATENT DOCUMENTS

CN    103077947 A    5/2013
JP    2009158813 A   7/2009
(Continued)

*Primary Examiner* — Fernando L Toledo
*Assistant Examiner* — Adam S Bowen
(74) *Attorney, Agent, or Firm* — Slater Matsil, LLP

(57) ABSTRACT

Structures and formation methods of a semiconductor device structure are provided. The semiconductor device structure includes a fin structure over a semiconductor substrate and a gate stack covering a portion of the fin structure. The gate stack includes a work function layer and a gate dielectric layer. The semiconductor device structure also includes an isolation element over the semiconductor substrate and adjacent to the gate stack. The isolation element is in direct contact with the work function layer and the gate dielectric layer, and a lower width of the isolation element is greater than an upper width of the isolation element

20 Claims, 12 Drawing Sheets

(51) Int. Cl.

| | | |
|---|---|---|
| *H01L 29/66* | (2006.01) | |
| *H01L 27/092* | (2006.01) | |
| *H01L 29/06* | (2006.01) | |
| *H01L 29/423* | (2006.01) | |
| *H01L 29/08* | (2006.01) | |
| *H01L 29/16* | (2006.01) | |
| *H01L 29/161* | (2006.01) | |
| *H01L 29/165* | (2006.01) | |
| *H01L 29/24* | (2006.01) | |
| *H01L 29/267* | (2006.01) | |
| *H01L 29/49* | (2006.01) | |
| *H01L 29/51* | (2006.01) | |

(52) U.S. Cl.
CPC .......... *H01L 29/161* (2013.01); *H01L 29/165* (2013.01); *H01L 29/1608* (2013.01); *H01L 29/24* (2013.01); *H01L 29/267* (2013.01); *H01L 29/42372* (2013.01); *H01L 29/4966* (2013.01); *H01L 29/517* (2013.01); *H01L 29/66545* (2013.01); *H01L 29/66553* (2013.01); *H01L 29/66795* (2013.01); *H01L 29/785* (2013.01); *H01L 29/7848* (2013.01); *H01L 29/7851* (2013.01)

(56) References Cited

U.S. PATENT DOCUMENTS

| | | |
|---|---|---|
| 2007/0281455 A1 | 12/2007 | Kim |
| 2008/0057672 A1 | 3/2008 | Rossi et al. |
| 2009/0166726 A1 | 7/2009 | Mine |
| 2012/0001259 A1 | 1/2012 | Chuang et al. |
| 2012/0286375 A1 | 11/2012 | Cal et al. |
| 2013/0037886 A1* | 2/2013 | Tsai ................ H01L 21/823821 257/351 |
| 2013/0049069 A1 | 2/2013 | Zhu et al. |
| 2013/0105906 A1 | 5/2013 | Yin et al. |
| 2014/0001543 A1 | 1/2014 | Kim et al. |
| 2014/0042491 A1 | 2/2014 | Chen et al. |
| 2014/0061814 A1 | 3/2014 | Kim et al. |
| 2014/0151814 A1 | 6/2014 | Giles et al. |
| 2014/0242775 A1 | 8/2014 | Lin et al. |
| 2014/0252486 A1 | 9/2014 | Lin et al. |
| 2014/0319623 A1* | 10/2014 | Tsai ................ H01L 21/823462 257/401 |
| 2015/0054029 A1 | 2/2015 | Jangjian et al. |
| 2015/0054078 A1 | 2/2015 | Xie et al. |
| 2015/0069524 A1 | 3/2015 | Hong et al. |
| 2015/0118835 A1 | 4/2015 | Lin et al. |
| 2015/0243563 A1 | 8/2015 | Lee et al. |
| 2015/0311125 A1* | 10/2015 | Ju ................ H01L 21/823821 257/369 |
| 2015/0357472 A1 | 12/2015 | Huang et al. |
| 2015/0380407 A1 | 12/2015 | Ji et al. |
| 2016/0056181 A1 | 2/2016 | Anderson et al. |

FOREIGN PATENT DOCUMENTS

| | | |
|---|---|---|
| KR | 1020140006204 A | 1/2014 |
| KR | 20140034347 | 3/2014 |
| KR | 20140111577 A | 9/2014 |
| TW | 201340218 A | 10/2013 |
| TW | 201349310 | 12/2013 |

* cited by examiner

STRUCTURE AND FORMATION METHOD OF SEMICONDUCTOR DEVICE STRUCTURE

PRIORITY CLAIM AND CROSS-REFERENCE

This application claims the benefit to and is a continuation of U.S. patent application Ser. No. 14/725,118, filed on May 29, 2015, and entitled "Structure and Formation Method of Semiconductor Device Structure" which application is incorporated herein by reference.

This application is related to the co-pending and commonly assigned U.S. patent application Publication Ser. No. 14/725,555, filed on May 29, 2015, and entitled "Structure and Formation Method of Semiconductor Device Structure", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
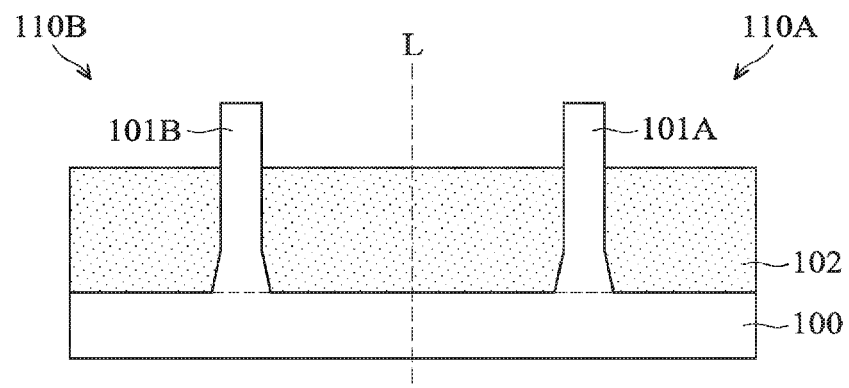
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the semiconductor substrate 100 is separated into portions 110A and 110B by an imaginary line L. In some embodiments, two or more transistors are formed in and/or over the portions 110A and 110B of the semiconductor substrate 100. In some embodiments, a p-type metal-oxide-semiconductor field effect transistor (PMOSFET) and an n-type metal-oxide-semiconductor field effect transistor (NMOSFET) will be formed in and/or over the portions 110A and 110B, respectively. In some other embodiments, an NMOSFET and a PMOSFET will be formed in and/or over the portions 110A and 110B, respectively. In some other embodiments, NMOSFETs will be formed in and/or over the portions 110A and 110B. In some other embodiments, PMOSFETs will be formed in and/or over the portions 110A and 110B.

As shown in FIG. 1A, multiple recesses (or trenches) are formed in the semiconductor substrate 100, in accordance with some embodiments. As a result, multiple fin structures including fin structures 101A and 101B are formed between the recesses. In some embodiments, one or more photolithography and etching processes are used to form the recesses.

As shown in FIG. 1A, isolation features 102 are formed in the recesses to surround lower portions of the fin structures 101A and 101B, in accordance with some embodiments. The isolation features 102 are used to define and electrically isolate various device elements formed in and/or over the semiconductor substrate 100. In some embodiments, the isolation features 102 include shallow trench isolation (STI) features, local oxidation of silicon (LOCOS) features, another suitable isolation feature, or a combination thereof.

In some embodiments, each of the isolation features 102 has a multi-layer structure. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 102. Similarly, the STI liner may also be used to reduce crystalline defects at the interface between the fin structures and the isolation features 102.

In some embodiments, a dielectric material layer is deposited over the semiconductor substrate 100. The dielectric material layer covers the fin structures including the fin structures 101A and 101B and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structures 101A and 101B are exposed. The planarization process may include a chemical mechanical polishing (CMP) process, a grinding process, an etching process, another applicable process, or a combination thereof. Afterwards, the dielectric material layer is etched back to form the isolation features 102. The fin structures including the fin structures 101A and 101B protrude from the isolation features 102, as shown in FIG. 1A in accordance with some embodiments.

Figure 1B:
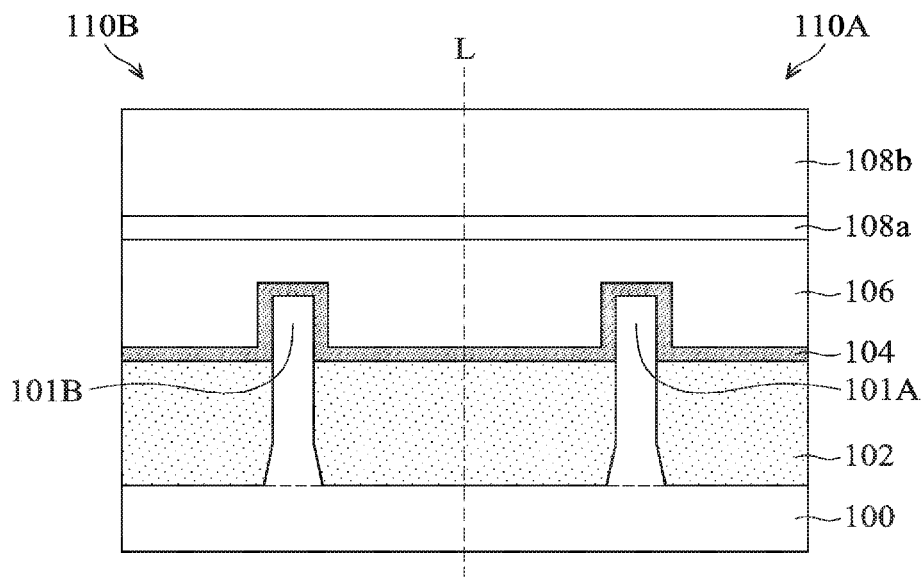

As shown in FIG. 1B, a gate dielectric layer 104 and a dummy gate electrode layer 106 are deposited over the isolation features 102 and the fin structures 101A and 101B, in accordance with some embodiments. In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed subsequently. The dummy gate dielectric layer is, for example, a silicon oxide layer.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof. In some embodiments, the dummy gate electrode layer 106 is made of polysilicon. For example, the dummy gate electrode layer 106 is deposited using a CVD process or another applicable process. Many variations and/or modifications can be made to embodiments of the disclosure. In some embodiments, the gate dielectric layer 104 is not formed.

Afterwards, a patterned hard mask layer is formed over the dummy gate electrode layer 106, as shown in FIG. 1B in accordance with some embodiments. The patterned hard mask layer is used to pattern the dummy gate electrode layer 106 and the gate dielectric layer 104 into one or more dummy gate stacks (or dummy gate lines). In some embodiments, the patterned hard mask includes a first hard mask layer 108a and a second hard mask layer 108b. In some embodiments, the first hard mask layer 108a is made of silicon nitride. In some embodiments, the second hard mask layer 108b is made of silicon oxide. In some embodiments, the second hard mask layer 108b is thicker than the first mask layer 108a.

In some embodiments, the dummy gate stacks are multiple dummy gate lines formed over the isolation features 102 and the fin structures 101A and 101B. In some embodiments, the dummy gate lines are substantially parallel to each other. In some embodiments, each of the dummy gate stacks (or dummy gate lines) is formed into two or more gate stacks of different transistors in subsequent processes.

In some embodiments, a patterned photoresist layer (not shown) is used to assist in the formation of the patterned hard mask layer. The patterned photoresist layer is formed using a photolithography process. The photolithography process may include photoresist coating (e.g., spin-on coating), soft baking, mask aligning, exposure, post-exposure baking, developing the photoresist, rinsing, drying (e.g., hard baking), another suitable process, or a combination thereof.

Figure 1C:
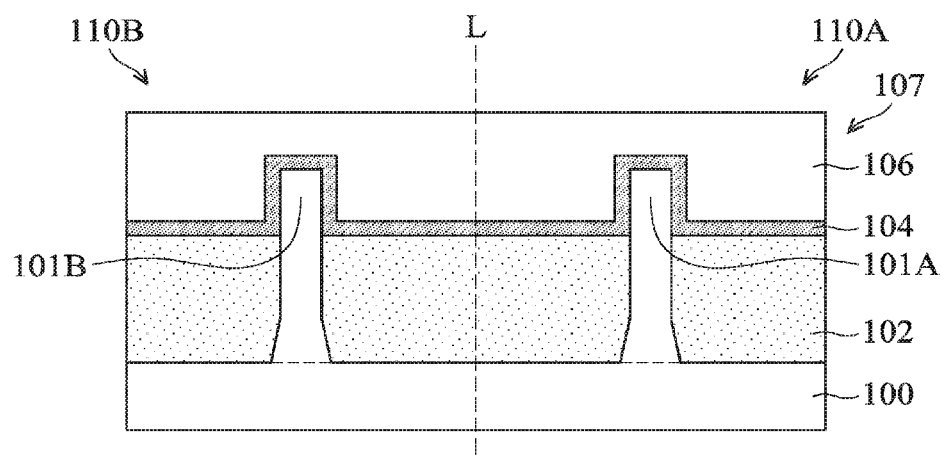

Afterwards, the dummy gate electrode layer 106 and the gate dielectric layer 104 are patterned to form one or more dummy gate stacks 107, as shown in FIG. 1C in accordance with some embodiments. In some embodiments, the hard mask layers 108a and 108b are removed afterwards.

Figure 2A:
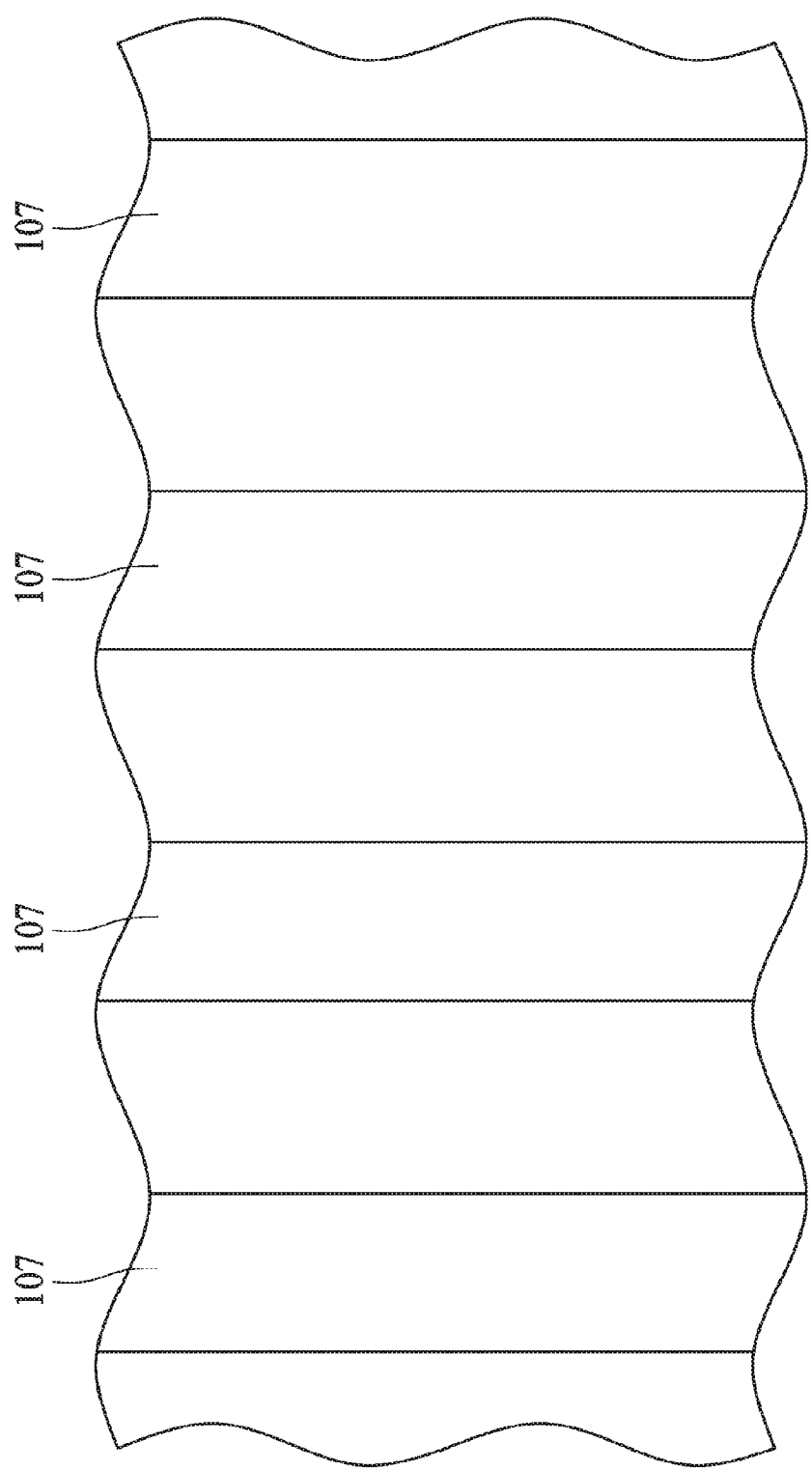
FIGS. 2A-2G are top views of various stages of a process for forming a semiconductor device structure, in accordance with some embodiments.

FIGS. 2A-2G are top views of various stages of a process for forming a semiconductor device structure, in accordance with some embodiments. In some embodiments, FIG. 2A is a top view of the structure shown in FIG. 1C. As shown in FIGS. 1C and 2A, multiple dummy gate stacks 107 are formed, in accordance with some embodiments. For brevity, only the dummy gate stacks 107 (or dummy gate lines) are shown in FIG. 2A. Each of the dummy gate stacks 107 includes the dummy gate electrode layer 106 and the gate dielectric layer 104. In FIGS. 1C and 2B-2G, only one of the dummy gate stacks 107 is shown for the sake of brevity.

Afterwards, source/drain structures are formed over the fin structures 101A and 101B and adjacent to the dummy gate stack 107, in accordance with some embodiments. FIGS. 3A-3D are cross-sectional views of various stages of a process for forming a semiconductor device structure, in accordance with some embodiments. In some embodiments, FIGS. 1C-1I are cross-sectional views taken along the line I-I of FIGS. 2B-2G. In some embodiments, FIGS. 3A-3C are cross-sectional views taken along the line J-J of FIGS. 2C-2G, and FIG. 3D is a cross-sectional view taken along the line K-K of FIG. 2G.

Figure 2C:
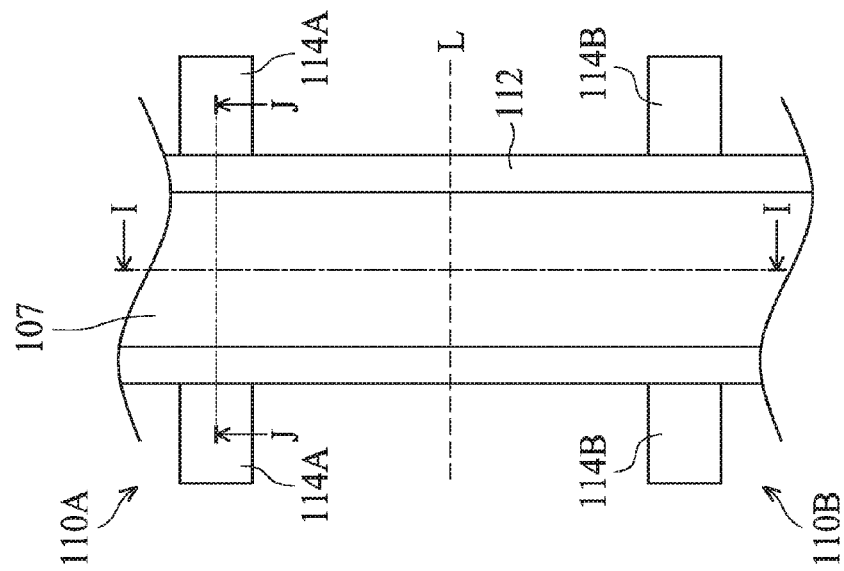
Figure 2B:
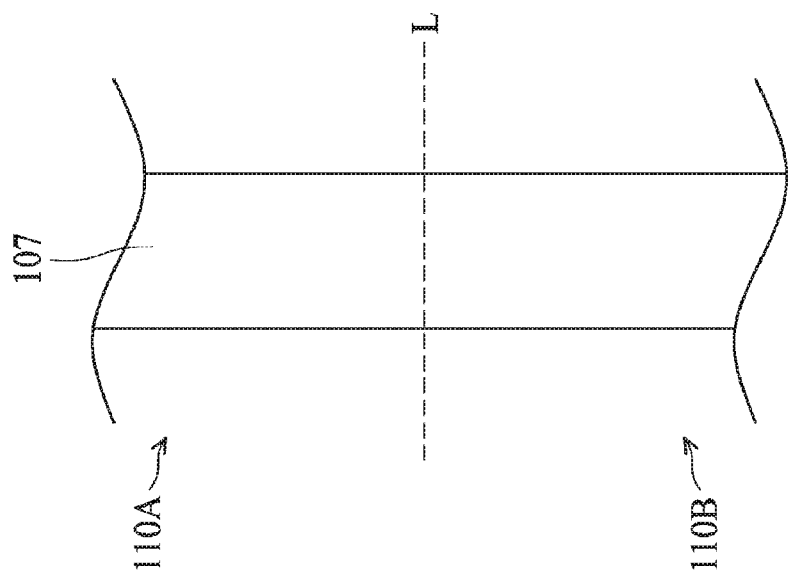
Figure 3A:
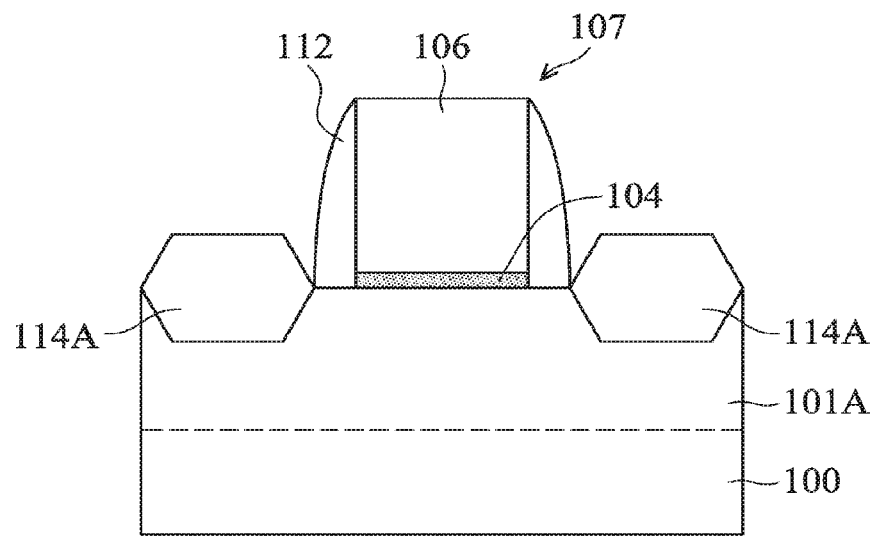
FIGS. 3A-3D are cross-sectional views of various stages of a process for forming a semiconductor device structure, in accordance with some embodiments.
Figure 3B:
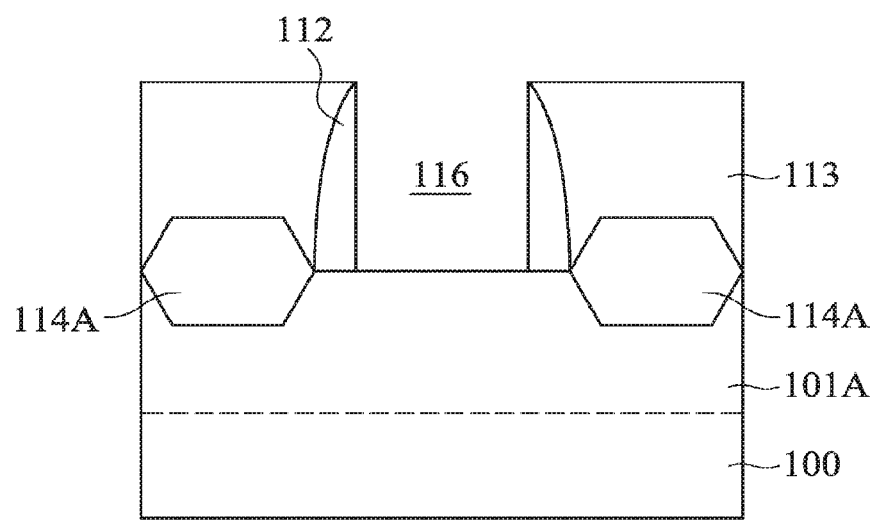
Figure 3C:
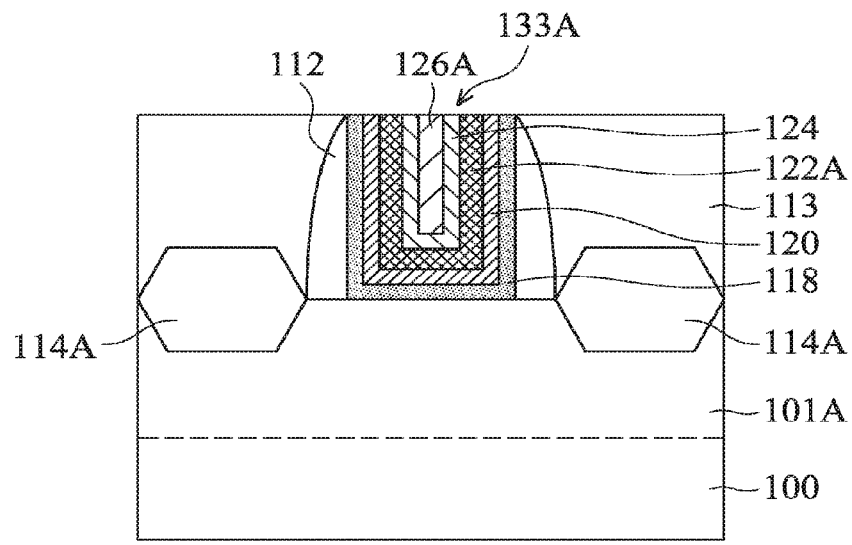

Referring to FIGS. 2C and 3A, source/drain structures 114A and 114B are formed over the semiconductor substrate 100 and between the dummy gate stack 107, in accordance with some embodiments. As mentioned above, in some embodiments, two transistors are formed in and/or over the portions 110A and 110B of the semiconductor substrate 100.

The source/drain structures 114A are a portion of the transistor formed in and/or over the portion 110A, and the source/drain region 114B are a portion of another transistor formed in and/or over the portion 110B.

In some embodiments, the fin structures 101A and 101B are recessed to be lower than top surfaces of the isolation features 102, in accordance with some embodiments. In some embodiments, an etching process is performed to remove upper portions of the fin structures 101A and 101B. As a result, recesses are formed above the fin structures 101A (and 101B), as shown in FIG. 3A. In some other embodiments, multiple etching operations are used so that the recesses further extend laterally towards channel regions below the dummy gate stack 107.

In some embodiments, a semiconductor material (or two or more semiconductor materials) is epitaxially grown over the fin structures that are recessed, growing continually to above the recesses, to form the source/drain structures 114A and 114B. In some embodiments, the growth of the source/drain structures 114A and 114B are performed simultaneously. In some embodiments, the growth of the source/drain structures 114A and 114B are performed separately in different processes.

In some embodiments, the source/drain structures 114A are a p-type semiconductor material. For example, the source/drain structures 114A may include epitaxially grown silicon germanium. The source/drain structures 114A are not limited to being a p-type semiconductor material. In some embodiments, the source/drain structures 114A are an n-type semiconductor material. The source/drain structures 114A may include epitaxially grown silicon, epitaxially grown silicon carbide (SiC), epitaxially grown silicon phosphide (SiP), or another suitable epitaxially grown semiconductor material.

In some embodiments, both of the source/drain structures 114A and 114B are p-type. In some embodiments, both of the source/drain structures 114A and 114B are n-type. In some embodiments, one of the source/drain structures 114A and 114B is p-type, and the other of the source/drain structures 114A and 114B is n-type.

In some embodiments, the source/drain structures 114A and 114B are formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain structures 114A and 114B may use gaseous and/or liquid precursors. In some embodiments, both the source/drain structures 114A and 114B are grown in-situ in the same process chamber. In other words, the source/drain structures 114A and 114B are formed using an in-situ epitaxial growth process. In some other embodiments, the source/drain structures 114A and 114B are grown separately.

The source/drain structures 114A and 114B include dopants. In some embodiments, multiple implantation processes are performed to dope the source/drain structures 114A and 114B. In some embodiments, spacer elements 112 are formed over sidewalls of the dummy gate stack 107 to assist in the formation of the source/drain structures 114A and 114B, as shown in FIGS. 2C and 3A. In some embodiments, lightly doped source/drain regions (not shown) are formed using ion implantation processes before the spacer elements 112 are formed.

In some embodiments, the source/drain structures 114A and 114B are doped in-situ during the growth of the source/drain structures 114A and 114B. In some other embodiments, the source/drain structures 114A and 114B are not doped during the growth of the source/drain structures 114A and 114B. After the epitaxial growth, the source/drain structures 114A and 114B are doped in a subsequent process. In some embodiments, the doping is achieved using an Ion implantation process, a plasma immersion ion implantation process, a gas and/or solid source diffusion process, another applicable process, or a combination thereof. In some embodiments, the source/drain structures 114A and 114B are further exposed to annealing processes to activate the dopants. For example, a rapid thermal annealing process is performed.

Figure 1D:
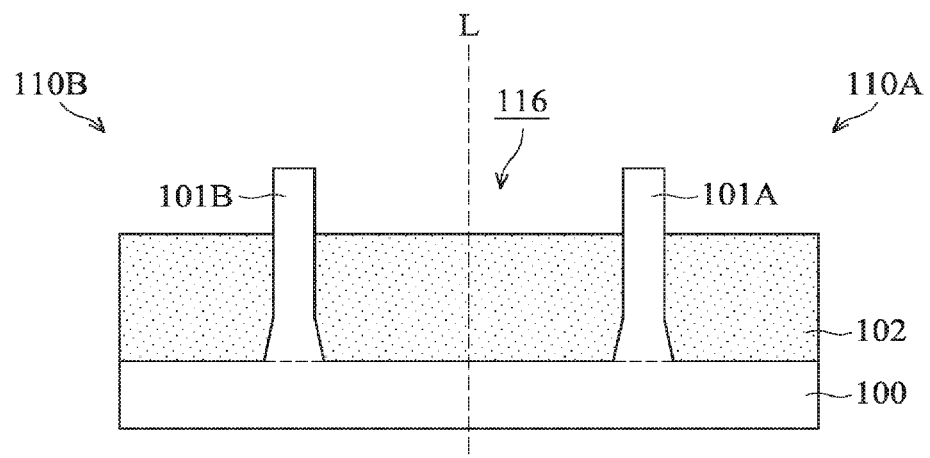
Figure 2E:
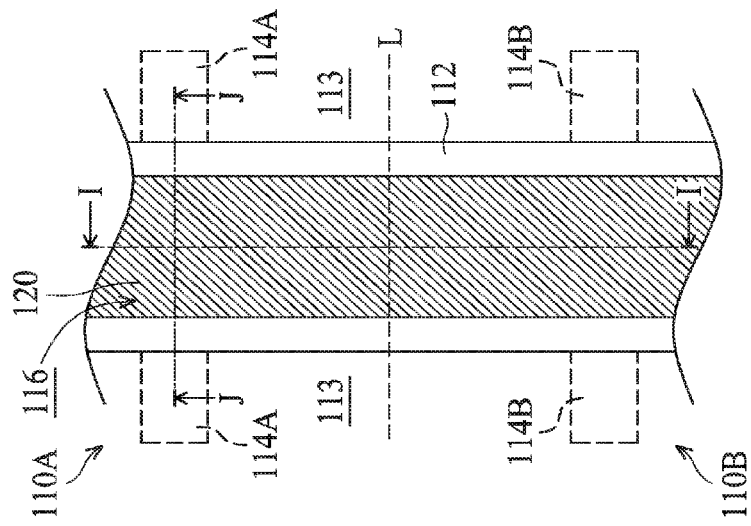
Figure 2D:
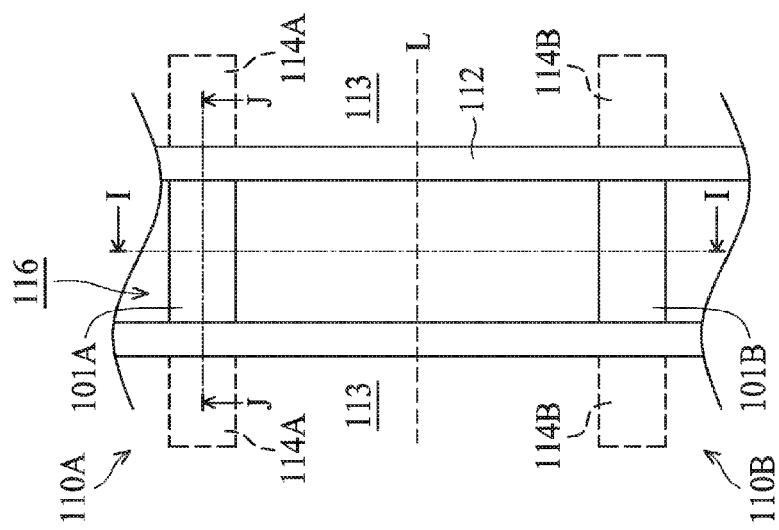

As shown in FIGS. 1D, 2D, and 3B, the dummy gate stacks 107 are removed, in accordance with some embodiments. In some embodiments, before the removal of the dummy gate stacks 107, a dielectric layer 113 is deposited over the source/drain structures 114A and 114B and the dummy gate stacks 107, as shown in FIGS. 2D and 3B. In some embodiments, the dielectric layer 113 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable dielectric material, or a combination thereof. In some embodiments, the dielectric layer 113 is deposited using a CVD process, a spin-on process, an ALD process, a PVD process, another applicable process, or a combination thereof.

Afterwards, the dielectric layer 113 is thinned down until the dummy gate electrode layer 106 is exposed. The thinned dielectric layer 113 surrounds the dummy gate stacks 107. In some embodiments, the dielectric layer 113 is thinned down using a planarization process. The planarization process may include a chemical mechanical polishing (CMP) process, a grinding process, an etching process, another applicable process, or a combination thereof. Many variations and/or modifications can be made to embodiments of the disclosure. In some other embodiments, the dielectric layer 113 is not formed.

Afterwards, the dummy gate stacks 107 are removed to form a trench 116 over the fin structures 101A and 101B and the isolation features 102, as shown in FIGS. 1D, 2D, and 3B in accordance with some embodiments. In some embodiments, the dielectric layer 113 is formed, and the trench 116 is formed in the dielectric layer 113. In other words, the dielectric layer 113 surrounds the trench 116. In some embodiments, the trench 116 is between the spacer elements 112. In some embodiments, the trench 116 exposes the portions of the fin structures 101A and 101B that are originally covered by the dummy gate stacks 107, as shown in FIGS. 1D, 2D, and 3B. The exposed portions of fin structures 101A and 101B may serve as channel regions. In some embodiments, the dummy gate stack 107 is removed using a dry etching process, a wet etching process, another applicable process, or a combination thereof. In some embodiments, the gate dielectric layer 104 is made of a high-K material and is not removed. In these cases, the trench 116 exposes the gate dielectric layer 104.

Figure 1E:
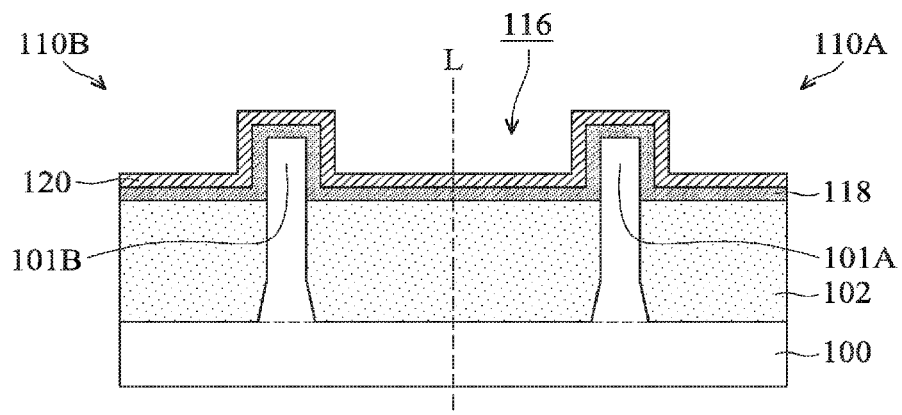

After the removal of the dummy gate stacks 107, some metal gate stack layers are deposited over the sidewalls and bottom of the trench 116, as shown in FIGS. 1E and 2E, in accordance with some embodiments. As mentioned above, in some embodiments, each of the dummy gate stacks 107 (or dummy gate lines) will be formed into two or more gate stacks of different transistors. Therefore, the trench 116 formed after the removal of the dummy gate stack 107 is long enough to contain two or more metal gate stacks of transistors. The depositions or fillings of the metal gate stack layers are easier than other cases where the depositions or fillings of the metal gate stack layers are performed in a recess designed to contain only one metal gate stack of a transistor. As a result, the process window is enlarged significantly.

In some embodiments, two transistors are formed in and/or over the portions 110A and 110B of the semiconductor substrate 100. In some embodiments, one of the transistors is a p-type transistor, and the other one is an n-type transistor. In some embodiments, both of the transistors are p-type transistors. In some embodiments, both of the transistors are n-type transistors. In some embodiments, one or more p-type work function layers are formed over the portion 110A, and one or more n-type work function layers are formed over the portion 110B. In some embodiments, one or more n-type work function layers are formed over the portion 110A, and one or more p-type work function layers are formed over the portion 110B.

Figure 3D:
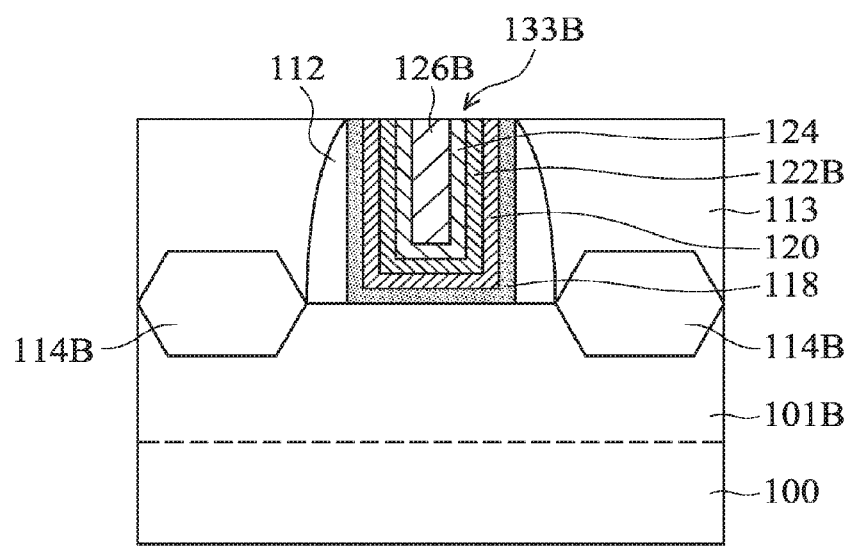

As shown in FIGS. 1E, 3C, and 3D, a gate dielectric layer 118 is deposited over the sidewalls and bottom of the trench 116, in accordance with some embodiments. In some embodiments, the gate dielectric layer 118 extends over both of the portions 110A and 110B. In some embodiments, the gate dielectric layer 118 extends over the fin structures 101A and 101B conformally. In some embodiments, the gate dielectric layer 118 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 118 is deposited using an ALD process, a CVD process, a spin-on process, another applicable process, or a combination thereof. In some embodiments, a high temperature annealing operation is performed to reduce or eliminate defects in the gate dielectric layer 118. Many variations and/or modifications can be made to embodiments of the disclosure. In some embodiments, two different gate dielectric layers are respectively formed over the portions 110A and 110B to serve as the gate dielectric layers of different transistors.

In some other embodiments, before the gate dielectric layer 118 is formed, an interfacial layer (not shown) is formed in the trench 116. The interfacial layer may be used to reduce stress between the gate dielectric layer 118 and the fin structures 101A and 101B. In some embodiments, the interfacial layer is made of silicon oxide. In some embodiments, the interfacial layer is formed using an ALD process, a thermal oxidation process, another applicable process, or a combination thereof.

As shown in FIGS. 1E, 2E, 3C, and 3D, a barrier layer 120 is deposited over the gate dielectric layer 118, in accordance with some embodiments. The barrier layer 120 may be used to interface the gate dielectric layer 118 with subsequently formed work function layers. The barrier layer 120 may also be used to prevent diffusion between the gate dielectric layer 118 and the subsequently formed work function layers. In some embodiments, the barrier layer 120 extends over the fin structures 101A and 101B conformally.

In some embodiments, the barrier layer 120 is made of a metal-containing material. The metal-containing material may include titanium nitride, tantalum nitride, another suitable material, or a combination thereof. In some embodiments, the barrier layer 120 includes multiple layers. In some embodiments, the barrier layer 120 is deposited using an ALD process, a PVD process, an electroplating process, an electroless plating process, a CVD process, another applicable process, or a combination thereof. In some other embodiments, the barrier layer 120 is not formed. In some embodiments, two different barrier layers are respectively formed over the portions 110A and 110B to serve as the barrier layers of different transistors.

Figure 1F:
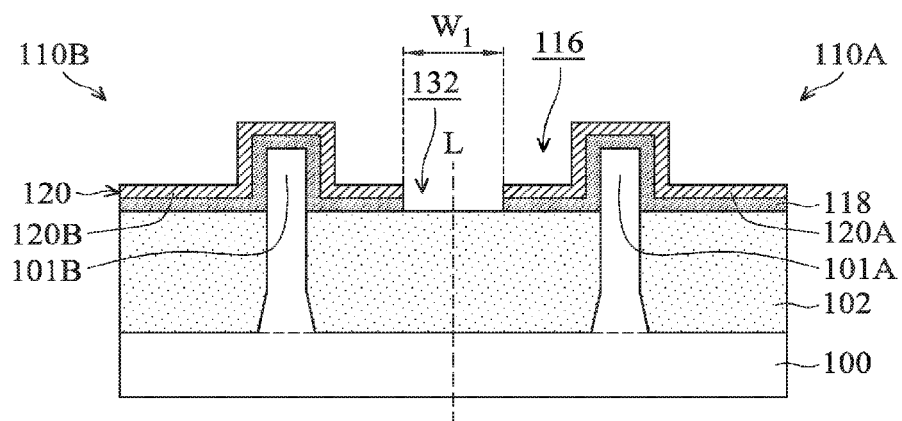
Figure 2G:
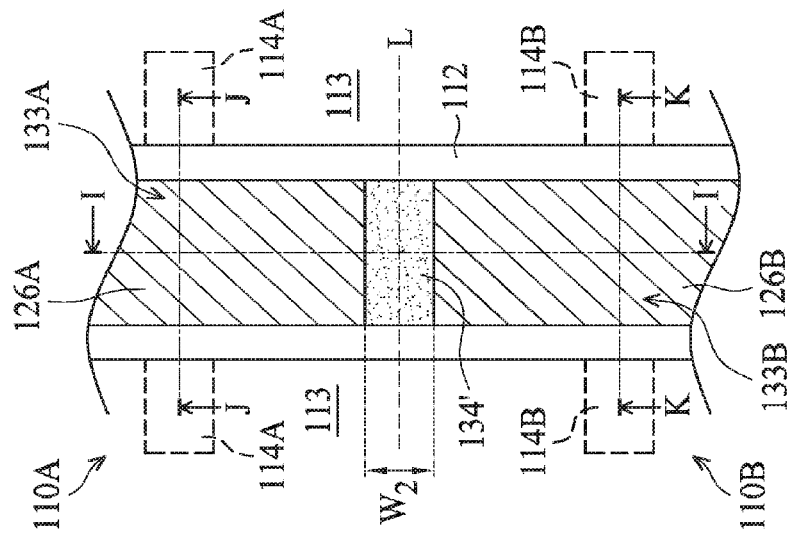
Figure 2F:
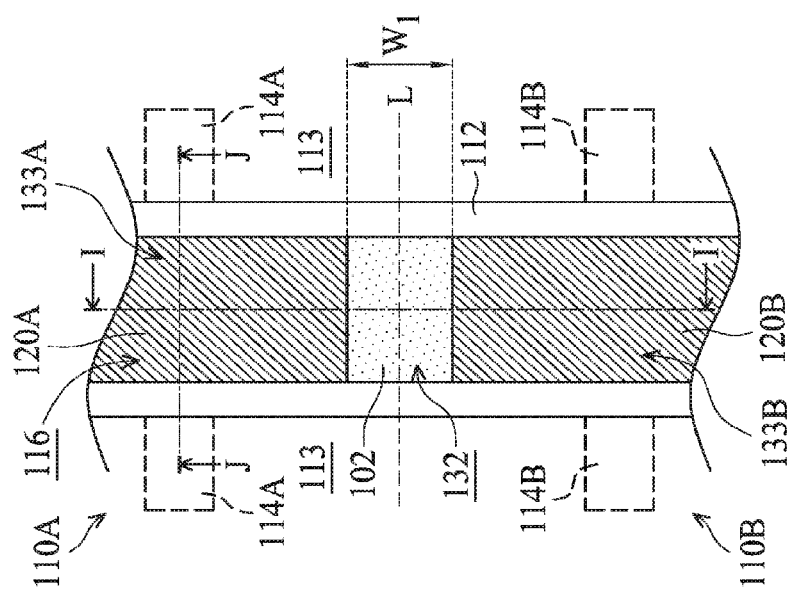

As shown in FIGS. 1F and 2F, portions of the gate dielectric layer 118 and the barrier layer 120 are removed to form one or more recesses 132, in accordance with some embodiments. The recess 132 separates the gate dielectric layer 118 and the barrier layer 120 into two portions, as shown in FIGS. 1F and 2F in accordance with some embodiments. As shown in FIGS. 1F and 2F, the recess 132 has a width $W_1$. In some embodiments, the width $W_1$ is in a range from about 15 nm to about 1000 nm. The barrier layer 120 is divided to form barrier elements 120A and 120B, as shown in FIGS. 1F and 2F. In some embodiments, the barrier elements 120A and 120B are not in direct contact with each other. As shown in FIGS. 1F and 2F, the recess 132 exposes the isolation feature 102, in accordance with some embodiments.

Many variations and/or modifications can be made to embodiments of the disclosure. In some embodiments, the barrier layer 120 is partially removed to form the barrier elements 120A and 120B, and the gate dielectric layer 118 is not removed. In these cases, the recess 132 exposes the gate dielectric layer 118.

Figure 1G:
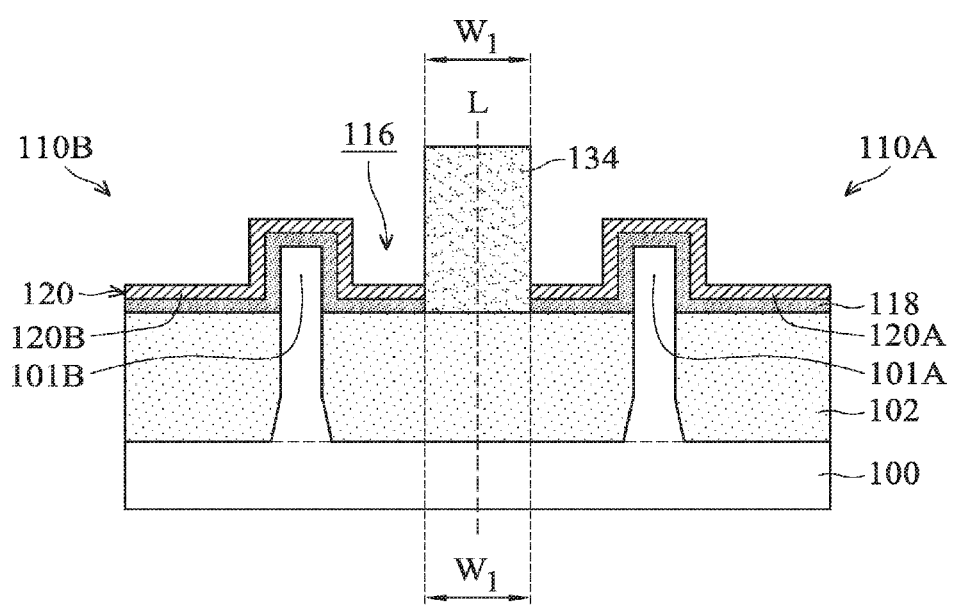

As shown in FIG. 1G, an isolation element 134 is formed in the trench 116 to fill the recess 132, in accordance with some embodiments. In some embodiments, a dielectric layer is deposited over the sidewalls and the bottom of the trench 116. Afterwards, the dielectric layer is patterned to form the isolation element 134, as shown in FIG. 1G, in accordance with some embodiments. In some embodiments, the width of the isolation element 134 is substantially equal to the width $W_1$ of the recess 132. In some embodiments, the isolation element 134 has a substantially vertical sidewall.

In some embodiments, the dielectric layer for forming the isolation element 134 is made of silicon oxide, silicon nitride, silicon oxynitride, carbon-containing silicon oxide, another suitable dielectric material, or a combination thereof. In some embodiments, the dielectric layer includes a polymer material. In some embodiments, the material of the dielectric layer is different from that of the dielectric layer 113. However, embodiments of the disclosure are not limited thereto. In some embodiments, the materials of the dielectric layer and the dielectric layer 113 are substantially the same.

In some embodiments, the dielectric layer is deposited using a CVD process, an ALD process, a flowable chemical vapor deposition (FCVD) process, a spin-on process, another applicable process, or a combination thereof. In some other embodiments, a spin-on process is used to form the dielectric layer. Afterwards, a photolithography process and an etching process are used to partially remove the dielectric layer to form the isolation element 132.

Many variations and/or modifications can be made to embodiments of the disclosure. In some embodiments, the isolation element 134 includes a multilayer structure. For example, multiple dielectric layers are deposited into the trench 116 to fill the recess 132. Similarly, a patterning process is performed to partially remove the dielectric layers. As a result, the isolation element 134 having a multilayer structure is formed.

Figure 1H:
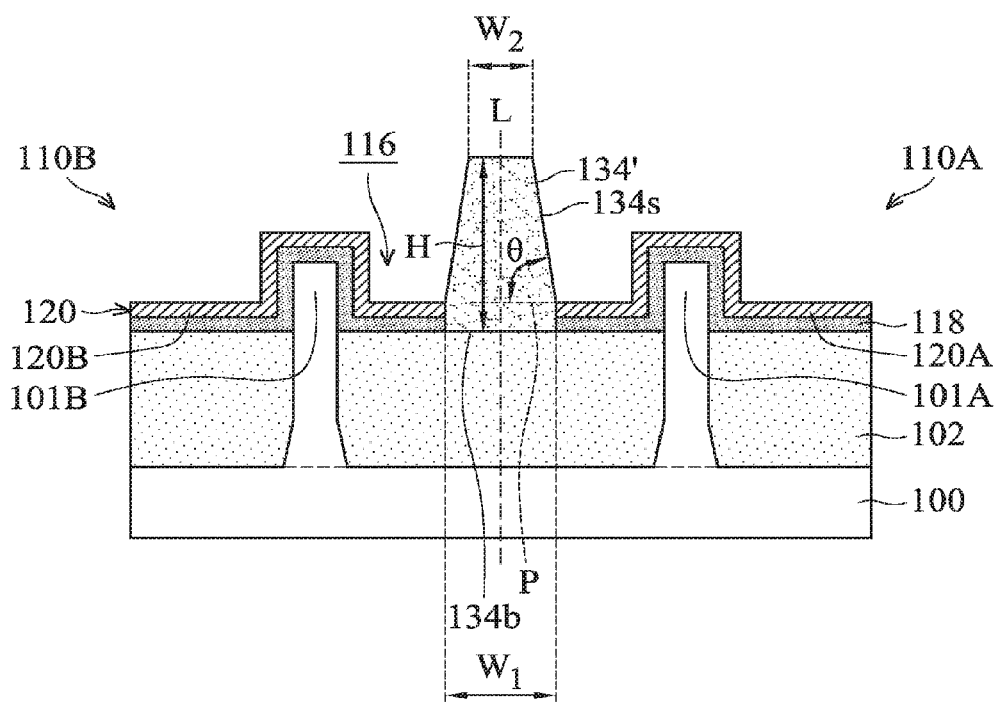

As shown in FIG. 1H, the isolation element 134 is partially removed to form a modified isolation element 134', in accordance with some embodiments. As shown in FIG. 1H, the modified isolation element 134' has an upper width $W_2$, a lower width $W_1$, and a height H. In some embodiments, the width W 1 is greater than the width $W_2$. In some embodiments, the width of the modified isolation element 134' gradually decreases along a direction from the top of the isolation element 134' towards the semiconductor substrate 100. In some embodiments, the isolation element 134' has a slanted sidewall.

In some embodiments, because the width $W_2$ is smaller than the width $W_1$, the subsequent formation of the other metal gate stack layers over the fin structures is easier since the opening is larger. The other metal gate stack layers may include a work function layer, a blocking layer, and a metal filling layer. As mentioned above, the width $W_1$ is in a range from about 15 nm to about 1000 nm in some embodiments. In some embodiments, the width $W_2$ is in a range from about 10 nm to about 500 nm. In some embodiments, the height H is in a range from about 50 nm to about 2000 nm. However, embodiments of the disclosure are not limited thereto. Each of the width $W_1$, the width $W_2$, and the height H may have a different range.

In some embodiments, the isolation element 134 is partially etched to form the modified isolation element 134'. By varying the etching conditions, the profile of the modified isolation element 134' can be fine-tuned. As shown in FIG. 1H, the modified isolation element 134' has a sidewall 134s and a bottom 134b. An angle θ between the sidewall 134s and an imaginary plane P that is parallel to the bottom 134b of the modified isolation element 134' may be tuned by varying the etching conditions. In some embodiments, the angle θ is in a range from about 10 degrees to about 85 degrees. In some other embodiments, the angle θ is in a range from about 20 degrees to about 75 degrees. In some cases, the angle θ should be greater than about 10 degrees to ensure that the width $W_2$ is wide enough to electrically isolate neighboring metal gate stacks that will be formed. In some cases, the angle θ should be smaller than about 85 degrees to ensure that the subsequent formation of the other metal gate stack layers over the fin structures is easy to perform.

In some embodiments, one or multiple etching operations are used to form the modified isolation element 134'. In some embodiments, the etchant used in the etching operations includes a gas mixture. The gas mixture may include $Cl_2$, HBr, $BCl_3$, $NF_3$, $N_2$, $CF_4$, $CH_2F_2$, $N_2$, $O_2$, Ar, $N_2H_2$, $SF_6$, $SiCl_4$, $CH_4$, another suitable gas, or a combination thereof. During the etching operations, the composition of the gas mixture may be varied according to the requirements. In some embodiments, the pressure used for performing the etching operations is in a range from about 1 mtorrs to about 80 mtorrs. In some embodiments, the operation power used for performing the etching operations is in a range from about 100 W to about 1500 W. In some embodiments, the operation temperature for performing the etching operations is in a range from about 10 degrees C. to about 80 degrees C. In some embodiments, the operation time for performing the etching operations is in a range from about 5 seconds to about 600 seconds.

Figure 1I:
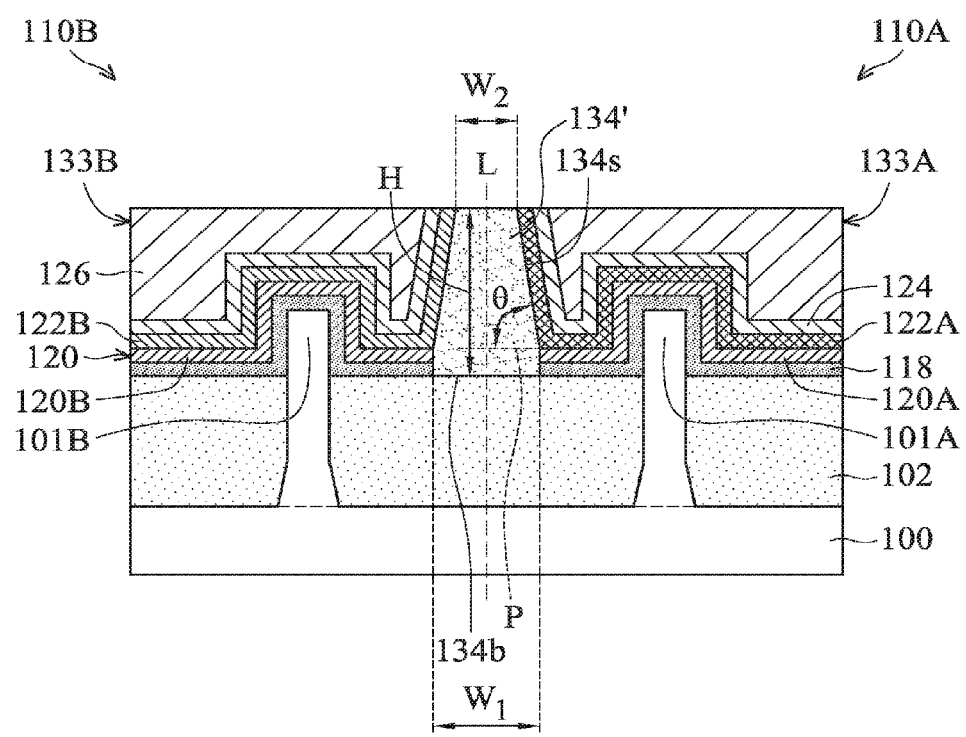

As shown in FIGS. 1I, 3C, and 3D, work function layers 122A and 122B are formed over the barrier layer 120 and the sidewalls of the isolation element 134', in accordance with some embodiments. The work function layer is used to provide the desired work function for transistors to enhance device performance including improved threshold voltage. In some embodiments, the work function layer 122A conformally extends over the fin structure 101A and the sidewall 134s of the isolation element 134'. Similarly, the work function layer 122B conformally extends over the fin structure 101B and a sidewall of the isolation element 134' opposite to the sidewall 134s.

In the embodiments of forming an NMOS transistor, the work function layer can be an n-type metal layer. The n-type metal layer is capable of providing a work function value that is suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, another suitable material, or a combination thereof.

On the other hand, in the embodiments of forming a PMOS transistor, the work function layer can be a p-type metal layer. The p-type metal layer is capable of providing a work function value that is suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium. titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

In some embodiments, the work function layer 122A is a p-type metal layer, and the work function layer 122B is an n-type metal layer. In some embodiments, the work function layer 122A is formed before the work function layer 122B. The work function layer 122A is deposited over the barrier layer 120. Afterwards, the work function layer 122A is patterned. For example, the work function layer 122A is positioned over the portion 110A of the semiconductor substrate 100. The portion of the work function layer 122A originally over the portion 110B is removed. For example, a photolithography process and an etching process are used to pattern the work function layer 122A. Similarly, the work function layer 122B is deposited and patterned over the portion 110B of the semiconductor substrate 100.

Many variations and/or modifications can be made to embodiments of the disclosure. In some other embodiments, the work function layer 122B is formed before the work function layer 122A. In some other embodiments, both of the work function layers 122A and 122B have the same conductivity type, such as n-type or p-type.

Afterwards, a blocking layer 124 is deposited over the work function layers 122A and 122B, as shown in FIGS. 1I, 3C, and 3D in accordance with some embodiments. The blocking layer 124 may be used to prevent a subsequently formed metal filling layer from diffusing or penetrating into the work function layers. In some embodiments, the blocking layer 124 is formed over the work function layers 122A and 122B conformally.

In some embodiments, the blocking layer 124 is made of tantalum nitride, titanium nitride, another suitable material, or a combination thereof. In some embodiments, the blocking layer 124 is deposited using an ALD process, a PVD process, an electroplating process, an electroless plating process, another applicable process, or a combination thereof.

Embodiments of the disclosure are not limited thereto. In some other embodiments, the blocking layer 124 is not formed. In some other embodiments, two different blocking layers are used between the subsequently formed metal filling layers and the different work function layers 122A and 124B.

Afterwards, a metal filling layer 126 is deposited over the blocking layer 124 to fill the trench 116, as shown in FIGS. 1I, 3C, and 3D in accordance with some embodiments. In some embodiments, the metal filling layer 126 is made of tungsten, aluminum, copper, cobalt, another suitable material, or a combination thereof. In some embodiments, the metal filling layer 126 is deposited using a PVD process, a CVD process, an electroplating process, an electroless plating process, another applicable process, or a combination thereof. In some other embodiments, the metal filling layer 126 is not formed. In some other embodiments, two different metal filling layers are formed over the portions 110A and 110B to serve as the metal filling layers of different transistors.

In some embodiments, a first set of metal gate stack layers are formed over the portion 110A, and the portion 110B is blocked by, for example, a patterned mask. Afterwards, a second set of metal gate stack layers are formed over the portion 110B, and the first set of metal gate stack layers are covered by another patterned mask.

In some embodiments, the metal gate stack layers, including the gate dielectric layer 118, the barrier layer 120, the work function layers 122A and 122B, the blocking layer 124, and the metal filling layer 126, together fill the trench 116 and cover the dielectric layer 113 and the isolation element 134'. In some embodiments, the portion of the metal gate stack layers outside of the trench 116 is removed. For example, a planarization process is used to partially remove the metal gate stack layers until the dielectric layer 113 and the isolation element 134' are exposed. The planarization process may include a CMP process, a grinding process, an etching process, another applicable process, or a combination thereof.

After the planarization process, multiple metal gate stacks including metal gate stacks 133A and 133B are formed, as shown in FIGS. 1I, 2G, 3C, and 3D in accordance with some embodiments. In some embodiments, after the planarization process, the metal filling layer 126 is divided into multiple portions including metal fillings 126A and 126B, as shown in FIGS. 1I, 2G, 3C, and 3D. In these cases, the materials of the metal fillings 126A and 126B are the same. In some other embodiments, the metal fillings 126A and 126B have different materials. In these cases, two different metal filling layers are deposited and patterned to form the metal fillings 126A and 126B. In some embodiments, the gate dielectric layers of the gate stacks 133A and 133B are portions of the gate dielectric layer 118. In these cases, the gate dielectric layers of the gate stacks 133A and 133B have the same material.

Some layers of the metal gate stack layers, such as the gate dielectric layer 118 and the barrier layer 120 are deposited in the trench 116 which is large enough to contain two or more gate stacks and has a relatively low aspect ratio. Therefore, the depositions of these layers could be performed well. The quality and the reliability of the metal gate stack layers are improved significantly. Some layers of the metal gate stack layers, such as the work function layers 122A and 122B, the blocking layer 124, and the metal filling layer 126 are formed after the modified isolation element 134' with a narrower top portion is formed. The depositions of these layers could be performed well since the opening is enlarged after the isolation element 134 is partially removed to form the modified isolation element 134'. The quality and the reliability of the metal gate stack layers are improved significantly. With the work function layers over the sidewalls of the isolation element 134', the work function level may be adjusted more precisely. The performance of the semiconductor device structure is improved.

As shown in FIGS. 1I and 2G, the isolation element 134' is adjacent to the gate stacks 133A and 133B, in accordance with some embodiments. In some embodiments, the isolation element 134' is in direct contact with the work function layers 122A and 122B, as shown in FIG. 1I. In some embodiments, the work function layer 122A extends on the sidewall 134s of the isolation element 134', and the work function layer 122B extends on a sidewall of the isolation element 134' opposite to the sidewall 134s. In some embodiments, the isolation element 134' is not in direct contact with the metal fillings 126A and 126B of the gate stacks 133A and 133B. In some embodiments, the work function layers 122A and 122B are not in direct contact with the spacer elements 112, as shown in FIGS. 3C and 3D. In some embodiments, the isolation element 134' is also in direct contact with the gate dielectric layer 120 of the gate stacks 133A and 133B. In some embodiments, the isolation element 134' is also in direct contact with the isolation feature 102, as shown in FIG. 1I.

As shown in FIGS. 1I and 2G, two transistors each including the gate stacks 133A and 133B are formed, in accordance with some embodiments. The isolation element 134' is formed between ends of the gate stacks 133A and 133B to electrically isolate the gate stack 133A from the gate stack 133B. The gate dielectric layer and the barrier layer are in direct contact with lower portions of the isolation element 134', and the work function layers are in direct contact with an upper portion of the isolation element 134'.

Embodiments of the disclosure form a semiconductor device structure with one or more metal gate stacks and fin structures. A dummy gate stack line is removed to form a trench where more than two metal gate stacks will be formed. Some layers of the metal gate stack layers for forming the metal gate stacks are deposited in the trench which is large enough to contain two or more gate stacks. Therefore, the depositions of these layers could be performed well. Some layers of the metal gate stack layers including a work function layer are formed after the modified isolation element with a narrower top portion is formed. Therefore, the trench still has a low aspect ratio, and the depositions of these layers could also be performed well. With the work function layers over the sidewalls of the isolation element, the performance of the semiconductor device structure is improved.

In accordance with some embodiments, a semiconductor device structure is provided. The semiconductor device structure includes a fin structure over a semiconductor substrate and a gate stack covering a portion of the fin structure. The gate stack includes a work function layer and a gate dielectric layer. The semiconductor device structure also includes an isolation element over the semiconductor substrate and adjacent to the gate stack. The isolation element is in direct contact with the work function layer and the gate dielectric layer, and a lower width of the isolation element is greater than an upper width of the isolation element.

In accordance with some embodiments, a semiconductor device structure is provided. The semiconductor device structure includes a first fin structure and a second fin structure over a semiconductor substrate. The semiconductor device structure also includes a first gate stack covering a portion of the first fin structure and a second gate stack covering a portion of the second fin structure. The semiconductor device structure further includes an isolation element adjacent to the first gate stack and the second gate stack. A lower width of the isolation element is greater than an upper width of the isolation element.

In accordance with some embodiments, a method for forming a semiconductor device structure is provided. The method includes forming a first fin structure and a second fin structure over a semiconductor substrate. The method also includes forming a dummy gate stack over the semiconductor substrate to partially cover the first fin structure and the second fin structure. The method further includes removing the dummy gate stack to form a trench over the semiconductor substrate and forming a gate dielectric layer in the trench. In addition, the method includes forming a recess in the gate dielectric layer and forming an isolation element in the trench to fill the recess. The method also includes forming a work function layer over the gate dielectric layer and a sidewall of the isolation element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

One general aspect of embodiments described herein includes a semiconductor device, including: a fin structure over a semiconductor substrate; a gate stack covering a portion of the fin structure, where the gate stack includes a work function layer and a gate dielectric layer, and a gate filling layer; and an isolation element over the semiconductor substrate and adjacent to the gate stack, where the isolation element is in direct contact with the work function layer and the gate dielectric layer and where the work function layer separates the isolation element and the gate filling layer.

Another general aspect of embodiments described herein includes a semiconductor device, including: a first fin structure and a second fin structure over a semiconductor substrate separated by a dielectric layer a first gate stack covering a portion of the first fin structure; a second gate stack covering a portion of the second fin structure; and an isolation element on the dielectric layer, between the first fin structure and the second fin structure, and adjacent to the first gate stack and the second gate stack, the isolation element electrically isolating the first gate stack and the second gate stack and being in contact with a sidewall of a first gate dielectric layer of the first gate stack and in contact with a sidewall of a second gate dielectric layer of the second gate stack.

Yet another general aspect of embodiments described herein includes a method for forming a semiconductor device structure, including: forming a first fin structure and a second fin structure over a semiconductor substrate; forming a dummy gate stack over the semiconductor substrate to partially cover the first fin structure and the second fin structure; removing the dummy gate stack to form a trench over the semiconductor substrate; forming a gate dielectric layer in the trench, the gate dielectric extending over the first fin structure and the second fin structure; forming a recess in the gate dielectric layer; forming an isolation element in the trench to fill the recess; and forming a first gate electrode in the trench and in contact with a first sidewall of the isolation element and forming a second gate electrode in the trench and in contact with a second opposite sidewall of the isolation element, where the isolation element electrically isolates the first gate electrode and the second gate electrode.

What is claimed is:

1. A semiconductor device, comprising:
    a fin structure over a semiconductor substrate;
    a gate stack covering a portion of the fin structure, wherein the gate stack comprises a gate dielectric layer, a first layer over the gate dielectric layer, and a gate filling layer; and
    an isolation element over the semiconductor substrate and adjacent to the gate stack, wherein the isolation element is in direct physical contact with the first layer and the gate dielectric layer and wherein the first layer separates the isolation element and the gate filling layer.

2. The semiconductor device of claim 1, wherein the gate stack further comprises a barrier layer between the gate dielectric layer and the first layer.

3. The semiconductor device of claim 2, wherein the gate stack further comprises a blocking layer between the first layer and the gate filling layer.

4. The semiconductor device of claim 1, wherein the first layer extends along a sidewall of the isolation element.

5. The semiconductor device of claim 1, wherein the first layer extends conformally over the fin structure and a sidewall of the isolation element.

6. The semiconductor device of claim 2, wherein:
    the isolation element comprises a material selected from the group consisting of silicon oxide, silicon nitride, silicon oxynitride, carbon-containing silicon oxide, a polymer, and combinations thereof;
    the gate dielectric layer comprises a material selected from the group consisting of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, and combinations thereof;
    the barrier layer comprises a metal-containing material;
    the first layer comprises a material selected from the group consisting of hafnium, zirconium, titanium, tantalum, aluminum, a metal carbide, hafnium carbide, zirconium carbide, titanium carbide, aluminum carbide, aluminides, ruthenium, palladium, platinum, cobalt, nickel conductive metal oxides, and combinations thereof; and
    the gate filling layer comprises a material selected from the group consisting of tungsten, aluminum, copper, cobalt, and combinations thereof.

7. The semiconductor device of claim 1, wherein the gate stack resides within a trench in a dielectric layer and wherein the trench is successively filled by the gate dielectric layer, a barrier layer, the first layer, a blocking layer, and the gate filling layer.

8. The semiconductor device of claim 1, wherein a first portion of the isolation element proximate the semiconductor substrate has a first width, and wherein a second portion of the isolation element distal the semiconductor substrate has a second width greater than the first width.

9. A semiconductor device, comprising:
a first fin structure and a second fin structure over a semiconductor substrate separated by a dielectric layer;
a first gate stack covering a portion of the first fin structure;
a second gate stack covering a portion of the second fin structure; and
an isolation element on the dielectric layer, between the first fin structure and the second fin structure, and adjacent to the first gate stack and the second gate stack, the isolation element electrically isolating the first gate stack and the second gate stack and being in contact with a sidewall of a first gate dielectric layer of the first gate stack and in contact with a sidewall of a second gate dielectric layer of the second gate stack, wherein the isolation element separates lower portions of the first and second gate stacks by a first distance and separates upper portions of the first and second gate stacks by a second distance less than the first distance.

10. The semiconductor device of claim 9, wherein the first gate stack comprises a first work function layer that extends up a sidewall of the isolation element and the second gate stack comprises a second work function layer that extends up an opposite sidewall of the isolation element.

11. The semiconductor device of claim 9, wherein the first gate stack comprises a first gate filling layer and a first work function layer, and wherein the first work function layer separates the isolation element from the first gate filling layer.

12. The semiconductor device of claim 11, wherein the second gate stack comprises a second gate filling layer and a second work function layer, the second work function layer comprising a different material than the first work function layer, and wherein the second work function layer separates the isolation element from the second gate filling layer.

13. The semiconductor device of claim 12, wherein the isolation element separates the first and second gate dielectric layers by the first distance and separates the first and second work function layers by the second distance.

14. The semiconductor device of claim 12, further comprising a p-type transistor formed in the first fin structure and an n-type transistor formed in the second fin structure.

15. The semiconductor device of claim 12, further comprising gate stack sidewall spacers on sidewalls of the first gate stack and on sidewall of the second gate stack.

16. The semiconductor device of claim 12, wherein sidewalls of the isolation element form an angle relative to a bottommost surface of the isolation element of from about 10 degrees to about 85 degrees.

17. The semiconductor device of claim 11, wherein the first gate stack further includes a first blocking layer between the first work function layer and the first gate filling layer.

18. A method for forming a semiconductor device structure, comprising:
forming a first fin structure and a second fin structure over a semiconductor substrate;
forming a dummy gate stack over the semiconductor substrate to partially cover the first fin structure and the second fin structure;
removing the dummy gate stack to form a trench over the semiconductor substrate;
forming a gate dielectric layer in the trench, the gate dielectric layer extending over the first fin structure and the second fin structure;
forming a metal containing barrier layer on the gate dielectric layer;
forming a recess in the gate dielectric layer and in the metal containing barrier layer;
forming an isolation element in the trench to fill the recess; and
forming a first gate electrode in the trench and in contact with a first sidewall of the isolation element and forming a second gate electrode in the trench and in contact with a second opposite sidewall of the isolation element, wherein the isolation element electrically isolates the first gate electrode and the second gate electrode.

19. The method of claim 18, further comprising partially etching the isolation element to modify a sidewall profile of the isolation element.

20. The method of claim 18, further comprising conformally depositing a work function layer on a sidewall of the isolation element.

* * * * *